United States Patent [19]
Jeffries et al.

[11] Patent Number: 6,017,226
[45] Date of Patent: Jan. 25, 2000

[54] CIRCUIT BOARD LOCATING CLIP

[75] Inventors: John Jeffries, Marble Falls; Gilberto Hernandez, Pflugerville, both of Tex.

[73] Assignee: Dell U.S.A., L.P., Round Rock, Tex.

[21] Appl. No.: 09/012,481

[22] Filed: Jan. 23, 1998

[51] Int. Cl.⁷ ....................................... H01R 4/66
[52] U.S. Cl. ............... 439/92; 361/683; 361/758
[58] Field of Search .......... 439/92, 95; 361/752, 361/758, 807, 809, 683, 684

[56] References Cited

U.S. PATENT DOCUMENTS

| | | |
|---|---|---|
| 5,218,760 | 6/1993 | Colton et al. ............................ 439/92 |
| 5,340,328 | 8/1994 | Lee . | |
| 5,513,996 | 5/1996 | Annerino et al. ........................ 439/95 |
| 5,529,502 | 6/1996 | Peltier et al. . | |
| 5,746,609 | 5/1998 | Franks, Jr. ............................... 439/92 |

*Primary Examiner*—Paula Bradley
*Assistant Examiner*—Katrina Davis
*Attorney, Agent, or Firm*—Haynes and Boone, L.L.P:.

[57] ABSTRACT

A computer chassis includes a circuit board. A locating clip is mounted on the circuit board. The clip includes a first planar portion having a first fastener opening. A circuit board gripping leg extends from a terminal end of the first planar portion and is inserted into a receiver slot in the circuit board. A second portion of the clip is connected to extend from the first clip portion at an angular disposition. The second clip portion has a fastener portion including a second fastener opening. A fastener advanced through the first and second fastener openings, through the board and into the chassis, urges the first planar portion and the board to move relative to the second clip portion and the fastener.

20 Claims, 4 Drawing Sheets

CIRCUIT BOARD LOCATING CLIP

BACKGROUND

The disclosures herein relate generally to a computer system and more particularly to a clip for positioning a circuit board in a computer chassis to maintain electromagnetic interference (EMI) contact between the circuit board and the chassis.

Various clips and fasteners have been provided for use with printed circuit boards (PC boards). In one application, an assembly for electrically interconnecting a printed circuit board to a flexible circuit carrier includes a retention clip for mechanically pressing the printed circuit board against the flexible circuit carrier. The printed circuit board includes a set of locating features which match with locating features located on the flexible circuit. A set of retention features match up with side locks located on the retention clip and maintain the clip engaged to the printed circuit board in a mechanically biased state. The clip also includes alignment apertures for receiving the locating features on the printed circuit board to aid in alignment of the assembly.

Another application provides a PC board connector which holds down the PC board firmly after installation. The PC board connector comprises an insulative connector body having locating posts and mounting posts symmetrically disposed at two opposite ends of either PC board mounting slot. Clips are fastened to either clip mounting hole between the locating posts and the mounting posts through hooked joints. Each locating post includes a horizontal extension rod received into a respective locating hole on the PC board in either PC board mounting slot. Each clip has a stop arm controlled by a handle portion to stop at one side of the PC board inserted in either PC board mounting slot to hold down the PC board in position. Each clip has two opposite pointed projections at two opposite lateral sides thereof and a hook on the front surface thereof in the middle for positioning in either clip mounting hole.

Circuit boards are typically mounted in computer chassis by means of fasteners such as screws. The screws are inserted through the circuit board and threaded into receivers mounted in the chassis. Once mounted, it is required that proper EMI shielding be provided.

Proper positioning of a circuit board in a computer chassis includes an EMI seal. The seal is accomplished by contact between the chassis and an edge of the circuit board and via a metal EMI shield including flexible spring fingers. However, the fingers in some cases are not long enough to ensure a good EMI seal in each instance due to manufacturing assembly and part tolerance variations. A proper EMI seal is critical for products expected to meet worldwide EMI standards.

Quality control inspection by manufacturer and customer for products to meet EMI standards is costly in terms of manpower requirements and time. As a result, cost is added to product and customer confidence is affected.

Therefore, what is needed is an apparatus and method which will compensate for the assembly and tolerance issues and provide a reliable and repeatable EMI seal between the circuit board and chassis.

SUMMARY

One embodiment, accordingly, provides an apparatus and method which provides in the assembly process an adjustment which positions the circuit board such that a remaining EMI gap is sealed. To this end, a circuit board locating clip includes a first planar portion having a first fastener opening formed therein. A circuit board gripping leg extends from a terminal end of the first planar portion. A second portion is connected to the first planar portion and is angularly disposed relative thereto. The second portion has a fastener portion including a second fastener opening formed therein.

A principal advantage of this embodiment is that any remaining EMI gap between the circuit board and the chassis is sealed by a final adjustment when the locating clip is secured to the board. This adjustment is provided by motion imposed on the board when the clip is secured in place.

DETAILED DESCRIPTION OF THE PREFERRED EMBODIMENT

Figure 1:
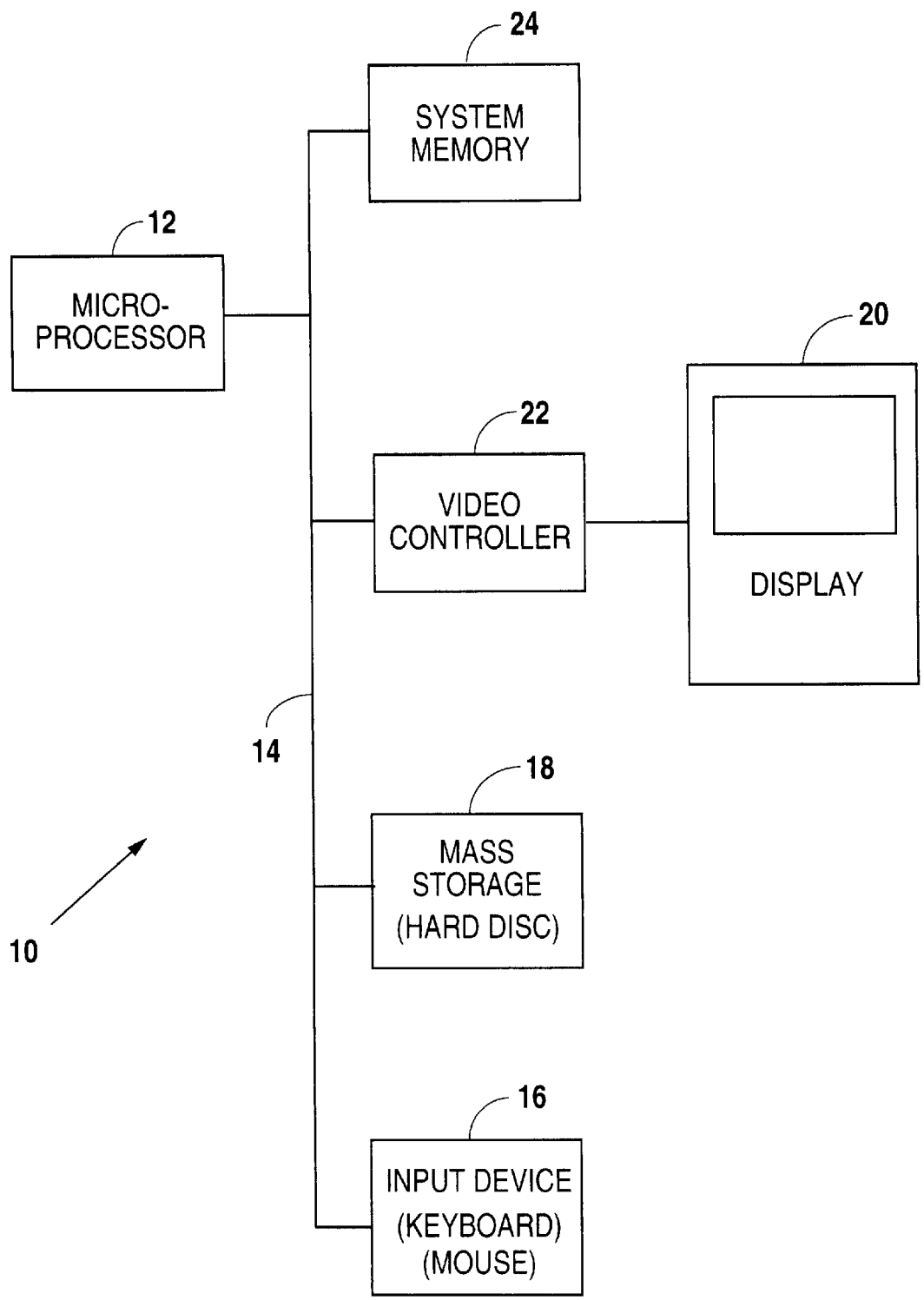
FIG. 1 is a diagrammatic view illustrating an embodiment of a computer system.

In one embodiment, computer system 10, FIG. 1, includes a microprocessor 12, which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 10 by a video controller 22. A system memory 24 is coupled to microprocessor 12 to provide the microprocessor with fast storage to facilitate execution of computer programs by microprocessor 12. It should be understood that other busses and intermediate circuits can be deployed between the components described above and microprocessor 12 to facilitate interconnection between the components and the microprocessor.

Figure 2:
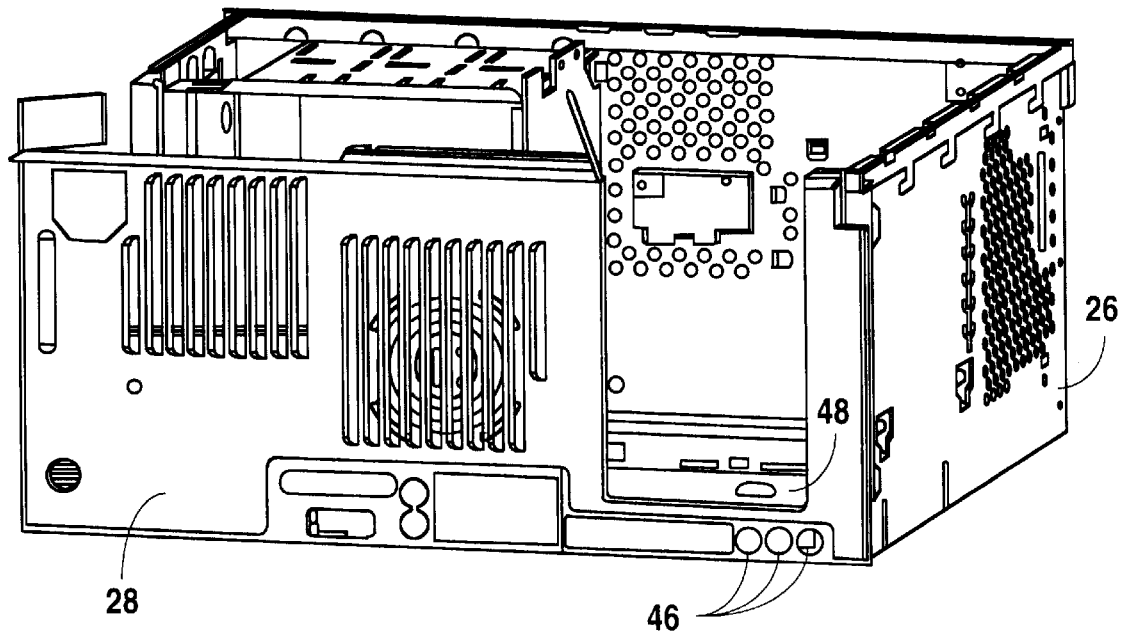
FIG. 2 is an isometric view illustrating an embodiment of a computer chassis.
Figure 3:
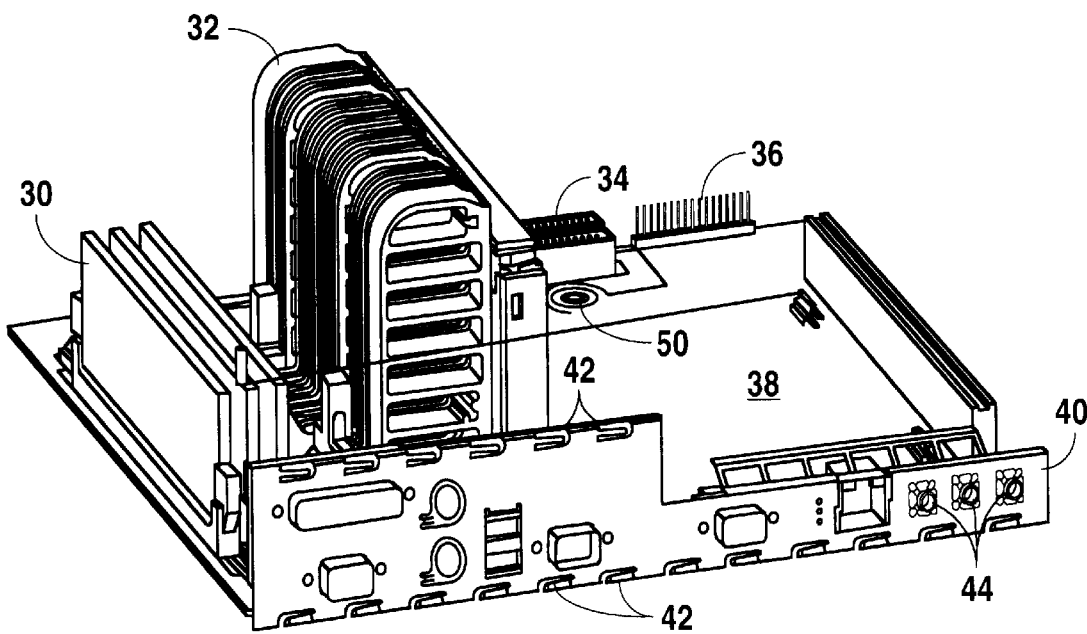
FIG. 3 is an isometric view illustrating an embodiment of a motherboard including some typical components.

A computer chassis 26, FIG. 2, includes a wall portion 28 used for EMI grounding. Components including memory modules 30, FIG. 3, a heat sink 32 and various contacts 34, 36, are typically mounted on and supported by a motherboard 38. A partition member 40, attached to motherboard 38, functions as an EMI shield and includes a plurality of flexible EMI grounding fingers 42. Referring to FIGS. 2 and 3, motherboard 38 is mounted in chassis 26 so that partition member 40 is immediately adjacent wall portion 28. It can be seen that a plurality of connector ports 44 are mated to extend through a plurality of openings 46 formed in wall portion 28. For EMI grounding purposes, the flexible fingers 42 are intended to engage wall portion 28 when the motherboard 38 is mounted in the chassis 26. In order to provide a final adjustment, if needed, for urging motherboard 38 and the connected partition member 40 into engagement with wall member 28 to enhance EMI grounding, a circuit board locating clip 50 is used to attach the motherboard 38 to a board mount structure 48 in the chassis 26.

Figure 4:
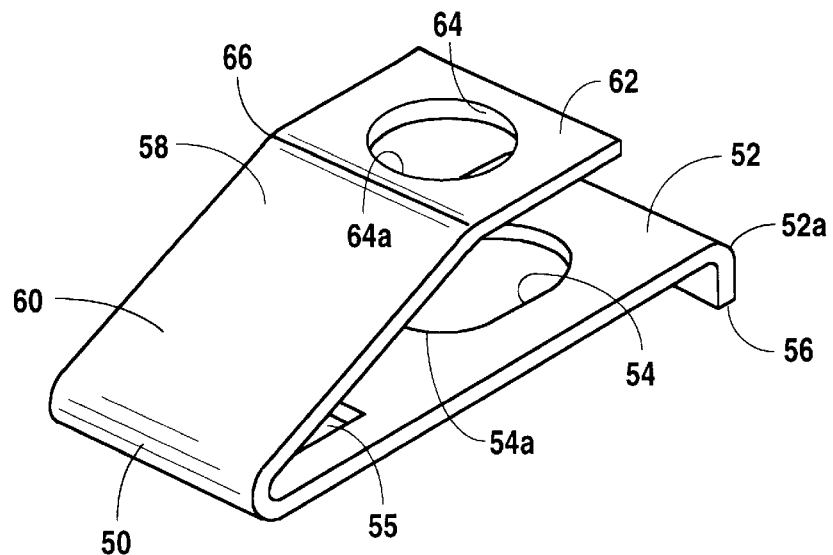
FIG. 4 is an isometric view illustrating an embodiment of a circuit board locating clip.
Figure 5:
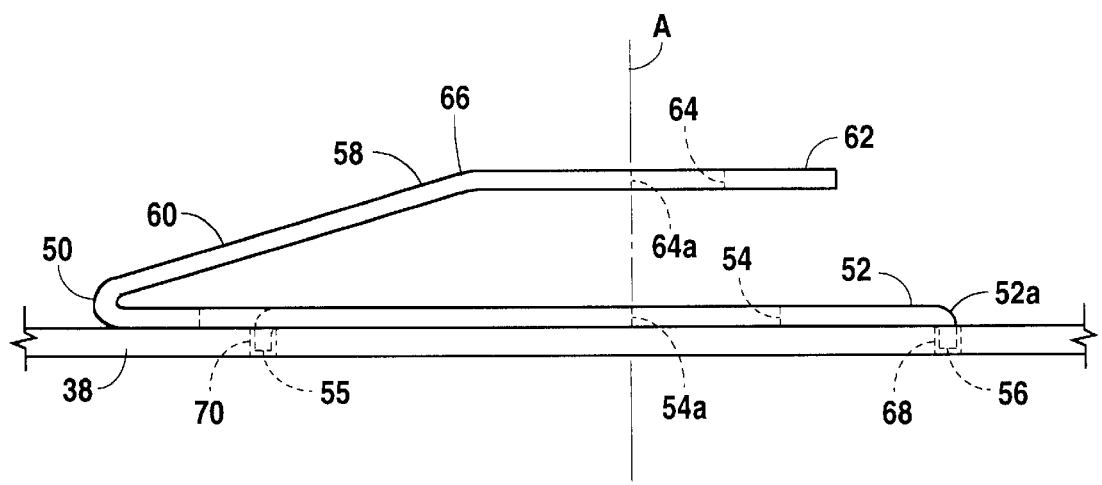
FIG. 5 is a side view illustrating an embodiment of the circuit board locating clip.

The circuit board locating clip 50, FIGS. 4 and 5, includes a first planar portion 52 which has a first fastener opening 54 formed therein. A circuit board gripping leg 56 extends from a terminal end 52a of the first planar portion 52. In addition, a circuit board locating leg 55, extends from the first planar portion 52. Leg 56 has a greater width than leg 55. A second portion 58 of the clip 50 is connected to the first planar portion 52 and includes a portion 60 which is angularly disposed relative to the first planar portion 52. The second portion 58 of the clip 50 also includes a fastener portion 62 which has a second fastener opening 64 formed therein.

The fastener portion 62 is provided to be substantially parallel to the first planar portion 52 by virtue of a bend 66 formed in the second portion 58 of the clip 50 between the angularly disposed portion 60 and the fastener portion 62. The first fastener opening 54 is oblong and the second fastener opening 64 is circular. The clip 50 is formed of a suitable spring steel material so that the second portion 58 is flexible toward and away from the first planar portion 52.

Figure 6:
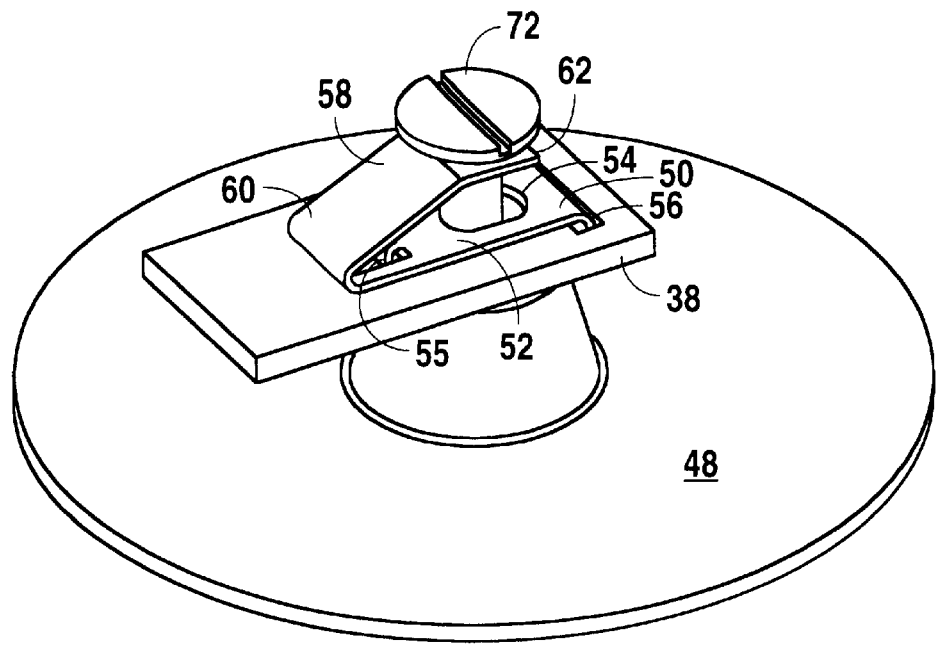
FIG. 6 is an isometric view illustrating an embodiment of a relaxed locating clip securing a portion of a motherboard to a chassis mount.
Figure 7:
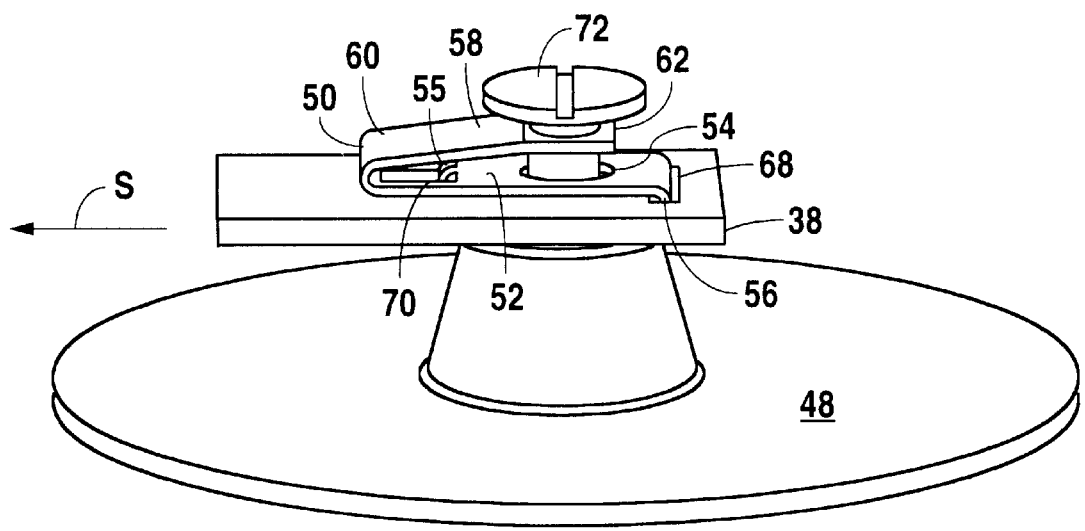
FIG. 7 is another isometric view illustrating an embodiment of a compressed locating clip securing a portion of a motherboard to a chassis mount.

The computer system 10 including microprocessor 12, input 16, storage 18, display 20, video controller 22 and memory 24, mounted in chassis 26, includes the motherboard 38 also mounted in the chassis 26. The locating clip 50, FIGS. 6 and 7, is mounted on a broken away portion of the motherboard 38. The first planar portion 52 of the clip 50 includes the first fastener opening 54 adjacent the motherboard 38. The circuit board gripping leg 56 and locating leg 55 extend from the first planar portion 52 and are each inserted into a respective receiver portion 68, 70 of the motherboard 38, see also FIG. 5. The second portion 58 of the clip 50 connected to extend angularly from the first portion 52, is in a raised position relative to the motherboard 38. The fastener portion 62, including the second fastener opening 64 is positioned substantially parallel to and raised relative to the first fastener opening 54 in the first planar portion 52. The locating leg 55 is of a first size and the gripping leg 56 is of a second size, different in width from the first size. The receiver portions 68, 70 are appropriately sized to respectively receive the gripping leg 56 and locating leg 55, thus accomplishing proper orientation and avoiding an incorrect mounting of the clip 50 on the board 38. The gripping and locating legs 56, 55, respectively, can be eliminated if desired and the first planar portion 52 of the clip 50 may be flow soldered directly onto the motherboard 38.

When the clip 50 is mounted on the motherboard 38, an edge 54a of the oblong opening 54 is vertically aligned along a line designated A, with an edge 64a of the circular opening 64 when the second portion 58 of the clip 50 is in a relaxed state, i.e. free of any flexure see FIG. 5.

In operation, the motherboard 38 may be moved into engagement with wall portion 28 of the chassis 26 by first mounting the motherboard 38 in the chassis 26 so that partition member 40 is adjacent chassis wall 28. The locating clip 50 is positioned on the motherboard 38. This may be accomplished by the gripping leg 56 and locating leg 55 extending into their respective receivers 68, 70, in the motherboard 38. A fastener 72 is inserted through the aligned first and second fastener openings 54, 64, respectively, in the clip 50. The fastener 72 is advanced into the chassis mount structure 48 so that the second portion 58 of the clip 50 is urged toward the first portion 52. The fastener 70 is initially engaged with the aligned edges 54a, 64a of the first and second fastener openings 54, 64, respectively. Further advancing of the fastener 72 causes the first planar portion 52 of the clip 50 to shift relative to the second portion 58 of the clip 50 in the direction indicated by the directional arrow designated S, FIG. 7. This is permitted by the oblong or slotted first fastener opening 54. As a result, the engagement of the first planar portion 52 with the motherboard 38 also moves the motherboard 38 in the direction indicated by the directional arrow designated S. This movement urges an edge of the motherboard 38 and associated partition 40 into an EMI seal with the chassis wall 28.

As it can be seen, the principal advantage of these embodiments is that the clip has two arms. One arm has a slotted opening and is installed to engage the circuit board. The other arm extends at an angle from the circuit board and has a circular opening. The center of the circular opening, one end of the slotted opening, the fastener receiving opening in the circuit board, the centroidal axis of the fastener and the fastener receiving opening in the chassis, are concentric. As the fastener is advanced into the chassis, the angle between the first and second clip portions decreases, and because of the different lengths of the first and second clip portions, measured from the fastener openings to the intersection of the first and second portions, the clip and the attached circuit board are urged in the desired direction. The required or desired amount of movement of the circuit board can be adjusted by varying the geometry of the first and second clip portions. The gripping and locating legs avoid improper orientation of the clip on the board. As a result, any remaining EMI gap between the circuit board and the chassis may be sealed by a final adjustment when the locating clip is secured to the board.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A circuit board locating clip comprising:
   a first planar portion having a first fastener opening formed therein;
   a circuit board gripping leg extended from a terminal end of the first planar portion;
   a circuit board locating leg extended from the first planar portion; and
   a second portion of the clip connected to the first planar portion and angularly disposed relative thereto, the second portion having a fastener portion, including a second fastener opening formed therein.

2. The clip as defined in claim 1 wherein the circuit board locating leg is of a first size and the gripping leg is of a second size, different in width from the first size.

3. The clip as defined in claim 1 wherein the fastener portion is parallel to the first planar portion.

4. The clip as defined in claim 1 wherein the second portion is flexible toward and away from the first planar portion.

5. The clip as defined in claim 1 wherein the first fastener opening is oblong.

6. The clip as defined in claim 5 wherein the second fastener opening is circular.

7. A computer system comprising:

a microprocessor;

an input coupled to provide input to the microprocessor;

a mass storage coupled to the microprocessor;

a display coupled to the microprocessor by a video controller;

a memory coupled to provide storage to facilitate execution of computer programs by the microprocessor;

a chassis having a circuit board mounted therein;

a circuit board locating clip mounted on the circuit board;

a first planar portion of the clip having a first fastener opening formed therein;

a circuit board gripping leg extended from a terminal end of the first planar portion and inserted into a portion of the circuit board; and a second portion of the clip connected to the first planar portion and angularly disposed relative thereto, the second portion having a fastener portion including a second fastener opening formed therein.

8. The system as defined in claim 7 further comprising a circuit board locating leg extending from the first planar portion.

9. The system as defined in claim 7 wherein the fastener portion is parallel to the first planar portion.

10. The clip as defined in claim 7 herein the second portion is flexible toward and away from the first planar portion.

11. The clip as defined in claim 7 wherein the first fastener opening is oblong.

12. The clip as defined in claim 11 wherein the second fastener opening is circular.

13. A computer chassis comprising:

a circuit board mounted in the chassis;

a circuit board locating clip mounted on the circuit board;

a first planar portion of the clip having a first fastener opening formed therein, the first planar portion being attached to the circuit board;

a second portion of the clip connected to the first planar portion and angularly disposed relative thereto, the second portion having a fastener portion including a second fastener opening formed therein; and a circuit board locating leg extended from the first planar portion and a circuit board gripping leg extended from a terminal end of the first planar portion and inserted into a receiver in the circuit board.

14. The system as defined in claim 13 wherein the circuit board locating leg is of a first size and the gripping leg is of a second size different in width from the first size.

15. The system as defined in claim 13 wherein the fastener portion is parallel to the first planar portion.

16. The clip as defined in claim 13 wherein the second portion is flexible toward and away from the first planar portion.

17. The clip as defined in claim 13 wherein the first fastener opening is oblong.

18. The clip as defined in claim 17 wherein the second fastener opening is circular.

19. The clip as defined in claim 18 wherein one edge of the oblong opening is vertically aligned with one edge of the circular opening when the second portion of the clip is free of flexure.

20. A method of moving a circuit board into engagement with a chassis comprising steps of:

mounting the circuit board in the chassis:

positioning a circuit board locating clip on the circuit board so that a gripping leg extended from the clip engages a receiver in the circuit board;

inserting a fastener through aligned fastener openings in the clip, through the circuit board and into the chassis, one of the fastener openings being oblong;

advancing the fastener into the chassis so that a raised angular portion of the clip moves toward a planar portion of the clip supported on the circuit board, the planar portion including the oblong fastener opening; and further advancing the fastener so that the gripping leg urges the planar portion of the clip and the circuit board to move relative to the angular portion and the fastener.

* * * * *

UNITED STATES PATENT AND TRADEMARK OFFICE
CERTIFICATE OF CORRECTION

PATENT NO.   : 6,017,226  
DATED        : January 25, 2000  
INVENTOR(S)  : John Jeffries and Gilberto Hernandez It is certified that error appears in the above-identified patent and that said Letters Patent is hereby corrected as shown below:

Column 5,
Line 29, please delete the word "herein" and insert therefor -- wherein --.

Signed and Sealed this

Third Day of September, 2002

*Attest:*

*Attesting Officer*

JAMES E. ROGAN
*Director of the United States Patent and Trademark Office*